United States Patent [19]
Chew et al.

[11] Patent Number: 5,618,756
[45] Date of Patent: Apr. 8, 1997

[54] SELECTIVE WSIX DEPOSITION

[75] Inventors: Peter Chew; Chuck Jang, both of Singapore, Singapore

[73] Assignee: Chartered Semiconductor Manufacturing Pte Ltd., Singapore, Singapore

[21] Appl. No.: 639,391

[22] Filed: Apr. 29, 1996

[51] Int. Cl.$^6$ .......................... H01L 21/312; H01L 21/44
[52] U.S. Cl. ........................ 438/586; 438/641; 438/592; 438/677
[58] Field of Search .................................... 437/200, 193, 437/231

[56] References Cited

U.S. PATENT DOCUMENTS

| | | | |
|---|---|---|---|
| 5,231,056 | 7/1993 | Sandhu | 437/200 |
| 5,300,455 | 4/1994 | Vuillermoz | 437/192 |

Primary Examiner—John Niebling
Assistant Examiner—Kevin F. Turner
Attorney, Agent, or Firm—George O. Saile; Rosemary L. S. Pike

[57] ABSTRACT

A method for selectively depositing $WSi_x$ is described. Semiconductor device structures are provided in and on a semiconductor substrate wherein $WSi_x$ is to be deposited overlying a first portion of the substrate and wherein $WSi_x$ is not to be deposited overlying a second portion of the substrate. A layer of organic material is provided over the surface of the substrate overlying the second portion of the substrate. A layer of $WSi_x$ is deposited over the surface of the substrate wherein the $WSi_x$ is deposited overlying the first portion of the substrate and wherein the presence of the organic material layer prevents the $WSi_x$ from depositing overlying the second portion of the substrate completing the selective $WSi_x$ deposition in the fabrication of an integrated circuit device.

19 Claims, 5 Drawing Sheets

5,618,756

SELECTIVE WSIX DEPOSITION

BACKGROUND OF THE INVENTION (1) Field of the Invention

The invention relates to the fabrication of integrated circuit devices, and more particularly, to a method of selective $WSi_x$ deposition in the fabrication of integrated circuits.

(2) Description of the Prior Art

In the fabrication of integrated circuits, WSix is deposited on top of polysilicon to form polycide gate and lines in order to lower Resistance Capacitance (RC) delays in circuits. In current fabrication processes, after the polysilicon is deposited and patterned, blanket $WSi_x$ is deposited followed by masking and etching to define the gates and lines. Selective $WSi_x$ deposition can be self-aligned to the pre-defined polysilicon line.

U.S. Pat. No. 5,300,455 to Vuillermoz et al discloses that tungsten will deposit selectively on silicon, but not on silicon dioxide. It is also known that $WSi_x$ will not deposit where organic materials are present.

SUMMARY OF THE INVENTION

It is therefore a principal object of the present invention to provide an effective and very manufacturable method of selectively depositing $WSi_x$.

A further object of the invention is to provide a method of pre-defining a pattern followed by selectively depositing $WSi_x$.

Yet another object is to provide a method of forming a barrier layer by pre-defining the pattern followed by selective $WSi_x$ deposition.

Yet another object is to provide a method of polycide formation by pre-defining the pattern followed by selective $WSi_x$ deposition in the fabrication of integrated circuit devices.

In accordance with the objects of this invention a method for selectively depositing $WSi_x$ is achieved. Semiconductor device structures are provided in and on a semiconductor substrate wherein $WSi_x$ is to be deposited overlying a first portion of the substrate and wherein $WSi_x$ is not to be deposited overlying a second portion of the substrate. A layer of organic material is provided over the surface of the substrate overlying the second portion of the substrate. A layer of $WSi_x$ is deposited over the surface of the substrate wherein the $WSi_x$ is deposited overlying the first portion of the substrate and wherein the presence of the organic material layer prevents the $WSi_x$ from depositing overlying the second portion of the substrate completing the selective $WSi_x$ deposition in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Instead of blanket deposition of $WSi_x$ followed by patterning, a different approach is proposed for $WSi_x$ deposition. The pattern is pre-defined followed by selective $WSi_x$ deposition. Selective $WSi_x$ deposition is possible because of the fact that $WSi_x$ will not deposit where organic materials are present.

Selective $WSi_x$ deposition can be used in many applications. Two examples will be presented here: polycide formation and barrier formation. It should be understood that this invention is not limited to the two examples described herein, but is equally applicable to a variety of $WSi_x$ deposition applications.

The following examples are given to show the important features of the invention and to aid in the understanding thereof. Variations may be made by one skilled in the art without departing from the spirit and scope of the invention.

Figure 1:
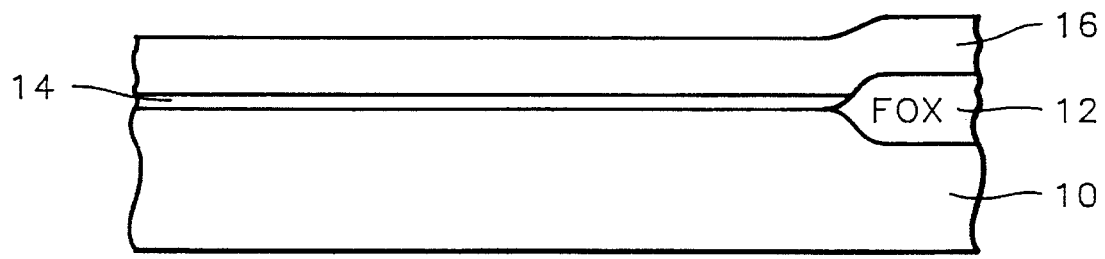
FIGS. 1 through 5 schematically illustrate in cross-sectional representation one preferred embodiment of the present invention.

The first example of polycide formation will be described with reference to FIGS. 1 through 5. Referring now more particularly to FIG. 1, there is shown an illustration of a portion of a partially completed integrated circuit. The semiconductor substrate 10 is preferably composed of silicon having a (100) crystallographic orientation. Field Oxide regions 12 may formed as are conventional in the art. The surface of the silicon substrate 10 is thermally oxidized to form the gate oxide layer 14.

Next, a layer of polysilicon 16 is deposited, for example, by low pressure chemical vapor deposition (LPCVD) to a suitable thickness of between about 1200 to 1500 Angstroms.

Figure 2:
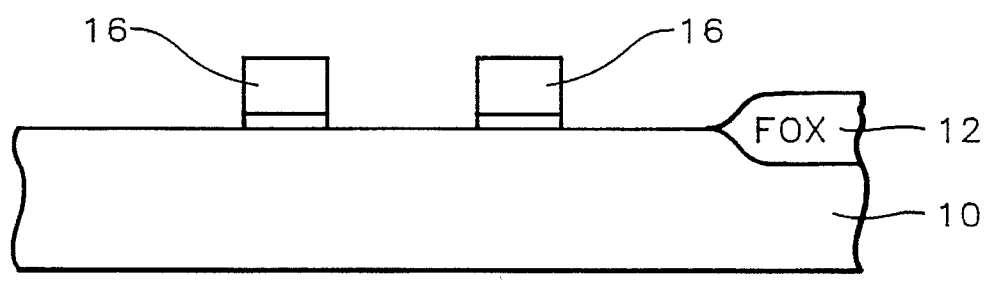

The polysilicon and oxide layers 16 and 14 are patterned and etched to provide gate electrodes and interconnecting lines, as shown in FIG. 2.

Figure 3:
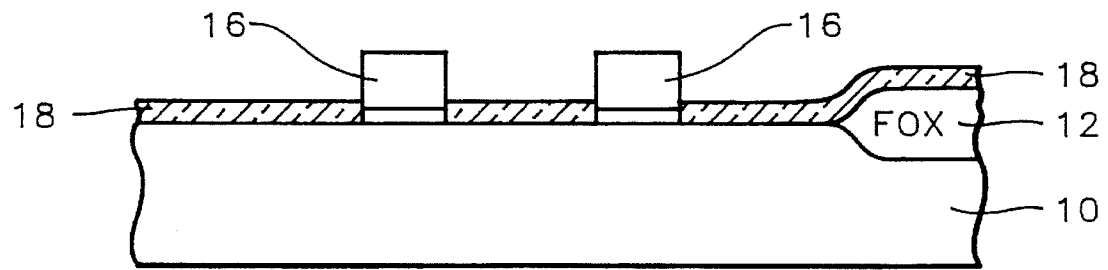

The key feature of the present invention will now be described. Referring now to FIG. 3, a thin layer of organic material is applied in the non-polysilicon areas. The organic material may be a photoresist or an organic polymer such as discussed in the paper, "Organic Polymers for IC Intermetal Dielectric Applications," by Neil H. Hendricks, *Solid State Technology*, July 1995, pp. 117–122. The organic material may be deposited, for example, by a spin-on technique, then removed from the polysilicon surfaces by a cleaning step such as blanket etching. The resulting organic material layer 18 coats the surface of the substrate, except for the polysilicon pattern, to a thickness of between about 1200 to 1500 Angstroms.

Figure 4:
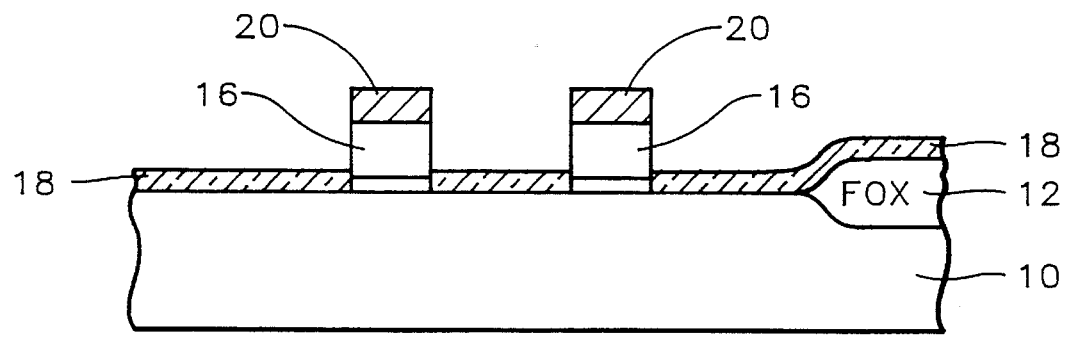

Referring now to FIG. 4, $WSi_x$ is blanket deposited over the surface of the substrate. $WSi_x$ will not deposit on the organic material 18, but only on the polysilicon 16, resulting in the selective formation of the polycide 20.

If the organic material is compatible with the subsequent oxide, it can be left in place. Otherwise, the organic material 18 can be removed by oxygen ashing, stripping, or the like.

Figure 5:
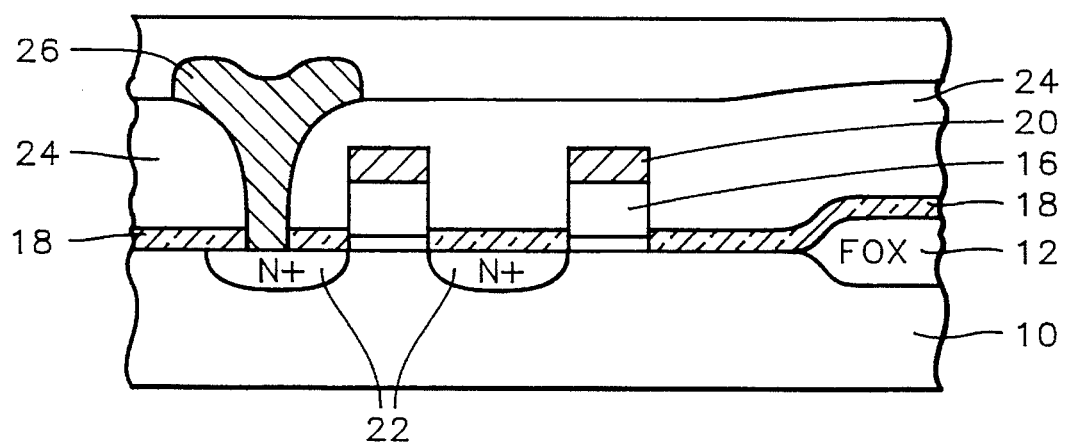

Processing continues as is conventional in the art to complete the integrated circuit device having polycide gate and interconnection lines, as illustrated in FIG. 5. For example, source and drain regions 22 are formed in the semiconductor substrate in associated with the polycide gate. Insulating layer 24 is deposited over the polycide gate and interconnection lines. A contact opening is made to one of the source and drain regions and a conducting layer 26 is deposited and patterned to complete the electrical connections.

Figure 6:
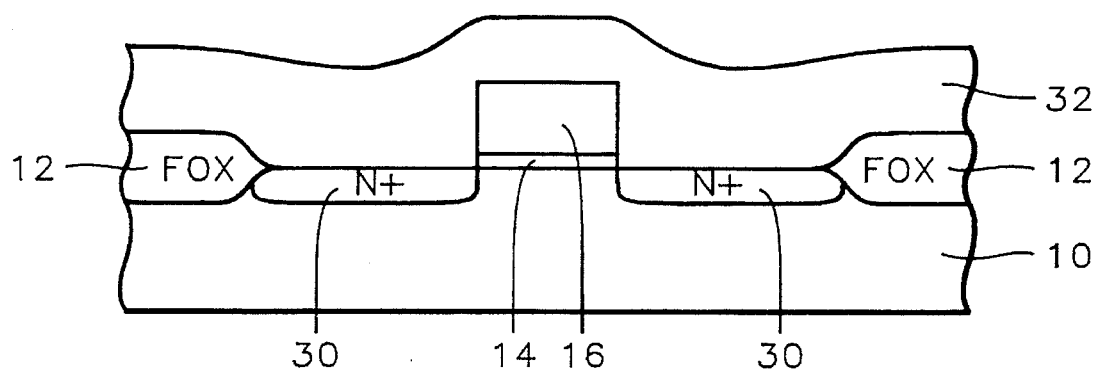
FIGS. 6 through 11 schematically illustrate in cross-sectional representation a second preferred embodiment of the present invention.

The second example of barrier formation will be described with reference to FIGS. 6 through 11. If $WSi_x$ is used as a barrier in a future application, the following is one possible way to deposit it. Referring now more particularly to FIG. 6, there is shown an illustration of a portion of a partially completed integrated circuit. The semiconductor substrate 10 is preferably composed of silicon having a (100) crystallographic orientation. Field Oxide regions 12 may formed as are conventional in the art. The surface of the silicon substrate 10 is thermally oxidized to form the gate oxide layer 14. A polysilicon layer is deposited and patterned to form a gate electrode 16. Source and drain regions 30 are formed as is conventional in the art. A thick insulating layer 32 of, for example, borophosphosilicate (BPSG) is blanket deposited over the surface of the substrate to a thickness of between about 8000 to 10,000 Angstroms.

Figure 7:
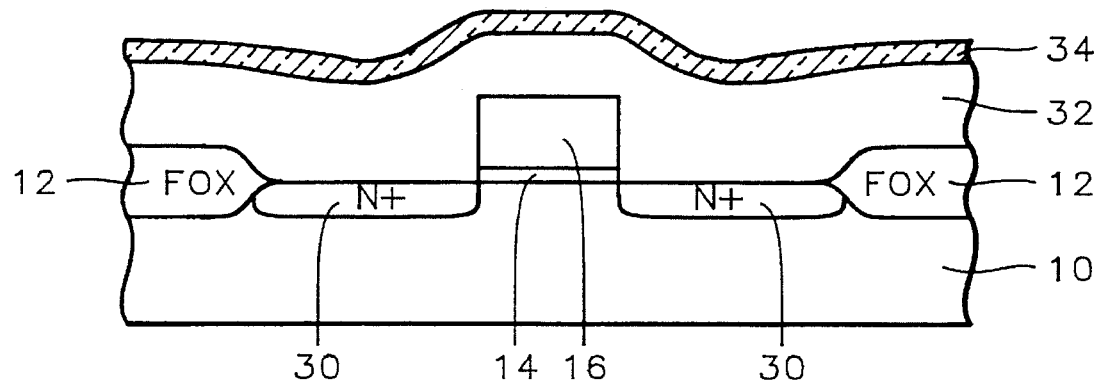

Referring to FIG. 7, a thin layer of an organic material 34 is deposited over the BPSG layer. If the organic material dielectric can replace the BPSG dielectric, as suggested in the abovementioned article to Hendricks, then the step of depositing the BPSG layer can be eliminated.

Figure 8A:
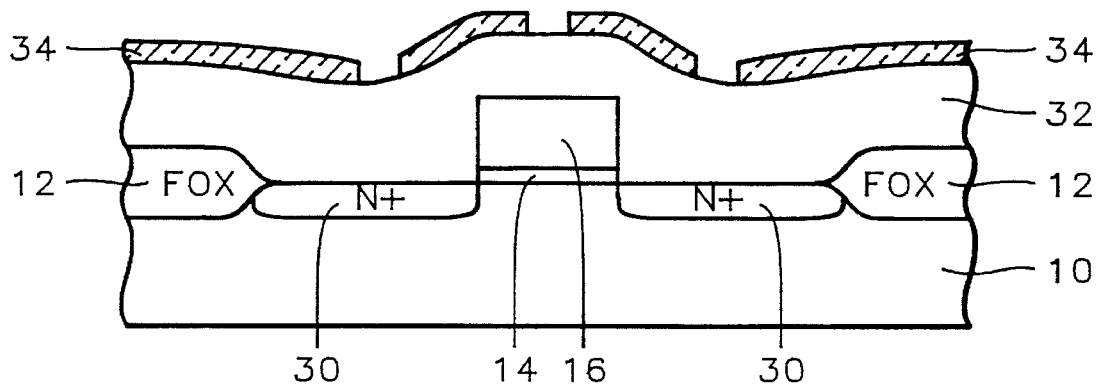
Figure 8B:
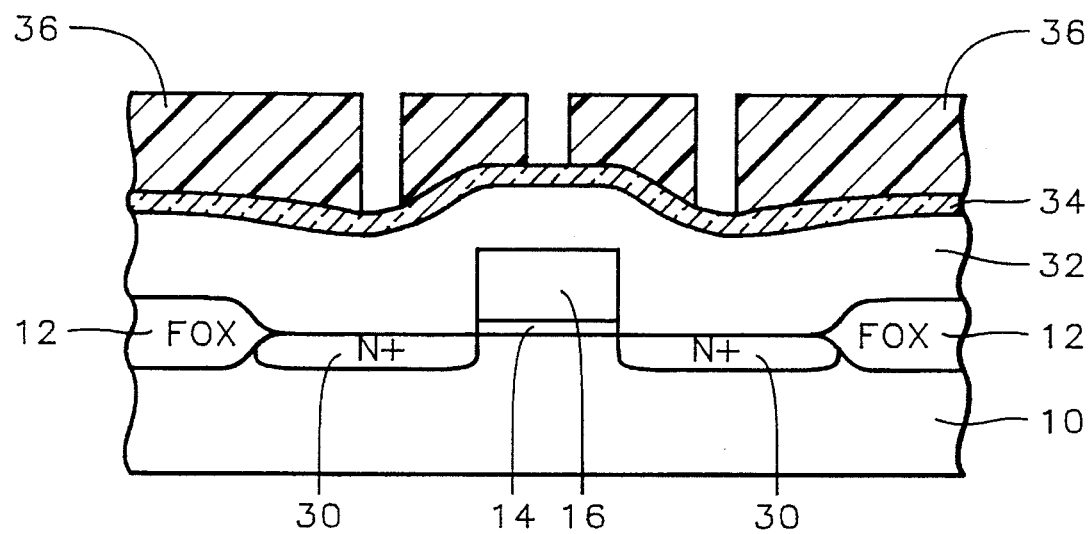

Referring now to FIGS. 8A and 8B, contacts are opened to the source and drain regions 30. If the organic material 34 is photosensitive, it can be directly exposed and developed to provide a mask for etching, as shown in FIG. 8A. If the organic material is not photosensitive, a photoresist layer 36 is used over the organic layer to provide the mask for etching the contact openings, as shown in FIG. 8B.

Figure 9:
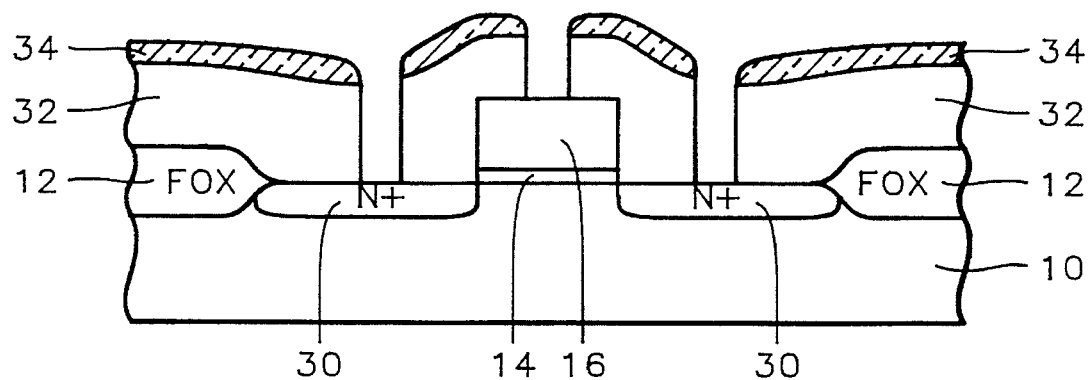
Figure 10:
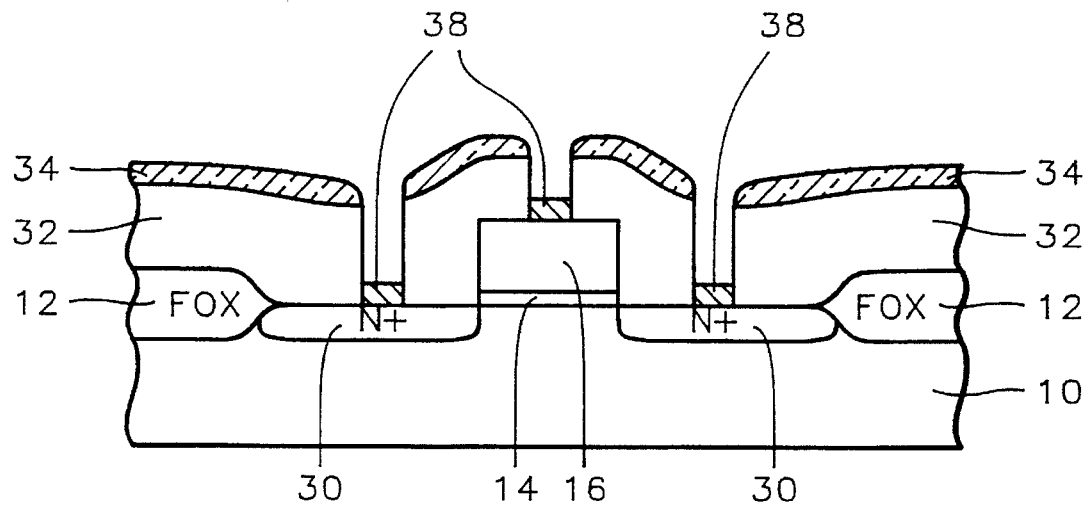

The contact openings are etched, using either the patterned organic layer as a mask, as in FIG. 8A, or a patterned photoresist layer as a mask, as in FIG. 8B. FIG. 9 illustrates the device after contact openings have been made.

Finally, a blanket $WSi_x$ deposition is performed. The $WSi_x$ does not deposit on the organic material 34, but only within the contact openings resulting in the formation of a barrier layer 38, illustrated in FIG. 10. The organic material 34 can be removed by oxygen ashing, stripping, or the like.

Figure 11:
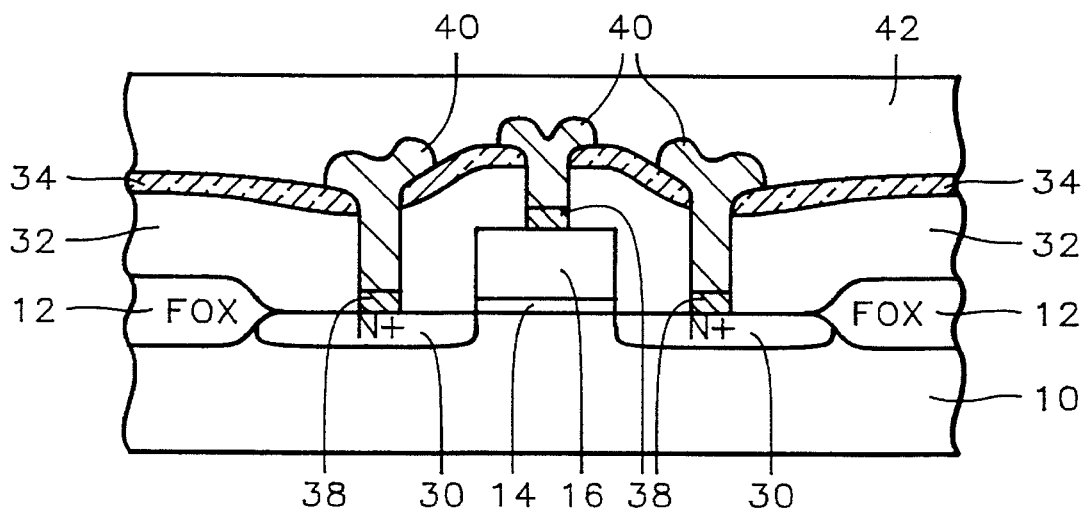

The integrated circuit device is completed as is conventional in the art. For example, as illustrated in FIG. 11, a conducting material 40 is deposited over the surface of the substrate and within the contact openings. It is patterned and then passivated with layer 42.

The process of the invention provides an effective method of selectively depositing $WSi_x$.

While the invention has been particularly shown and described with reference to the preferred embodiments thereof, it will be understood by those skilled in the art that various changes in form and details may be made without departing from the spirit and scope of the invention.

What is claimed is:

1. A method of selective $WSi_x$ deposition in the fabrication of an integrated circuit device comprising:

providing semiconductor device structures in and on a semiconductor substrate wherein $WSi_x$ is to be deposited overlying a first portion of said substrate and wherein $WSi_x$ is not to be deposited overlying a second portion of said substrate;

providing a layer of organic material over the surface of said substrate overlying said second portion of said substrate; and depositing a layer of $WSi_x$ over the surface of said substrate wherein said $WSi_x$ is deposited overlying said first portion of said substrate and wherein the presence of said organic material layer prevents said $WSi_x$ from depositing overlying said second portion of said substrate completing said selective $WSi_x$ deposition in the fabrication of said integrated circuit device.

2. The method according to claim 1 wherein said organic material comprises photoresist material.

3. The method according to claim 1 wherein said organic material comprises organic polymer material.

4. The method according to claim 1 wherein said providing said layer of organic material comprises:

spin-coating said organic material over the surface of said substrate; and etching back said organic material so that said organic material remains only overlying said second portion of said substrate.

5. The method according to claim 1 wherein said organic material layer has a thickness of between about 1200 to 1500 Angstroms.

6. The method according to claim 1 wherein said first portion of said substrate comprises polysilicon gate electrodes and interconnection lines and wherein said $WSi_x$ layer overlying said polysilicon comprises polycide gate electrodes and interconnection lines.

7. The method according to claim 1 wherein said second portion of said substrate comprises a gate electrode on the surface of said semiconductor substrate and source and drain regions within said semiconductor substrate covered by an insulating layer and wherein said first portion of said substrate comprises the surface of said gate electrode and said source and drain regions within contact openings and wherein said $WSi_x$ provides a barrier layer within said contact openings.

8. A method of selective $WSi_x$ deposition in the fabrication of an integrated circuit device comprising:

providing polysilicon gate electrodes and interconnection lines on the surface of a semiconductor substrate wherein said polysilicon gate electrodes and interconnection lines form a first portion of said substrate and wherein said surface of said substrate not covered by said polysilicon gate electrodes and interconnection lines forms a second portion of said substrate; providing a layer of organic material over the surface of said substrate overlying said second portion of said substrate and not overlying said first portion of said substrate; and depositing a layer of $WSi_x$ over the surface of said substrate wherein said $WSi_x$ is deposited overlying said polysilicon gate electrodes and interconnection lines and wherein the presence of said organic material layer prevents said $WSi_x$ from depositing over said second portion of said substrate completing said selective $WSi_x$ deposition in the fabrication of said integrated circuit device.

9. The method according to claim 8 wherein said organic material comprises photoresist material.

10. The method according to claim 8 wherein said organic material comprises organic polymer material.

11. The method according to claim 8 wherein said providing said layer of organic material comprises:

spin-coating said organic material over the surface of said substrate; and etching back said organic material so that said organic material is removed from said top surfaces of said polysilicon gate electrodes and interconnection lines.

12. The method according to claim 8 wherein said organic material layer has a thickness of between about 1200 to 1500 Angstroms.

13. The method according to claim 8 wherein said $WSi_x$ layer overlying said polysilicon gate electrodes and interconnection lines comprises polycide gate electrodes and interconnection lines.

14. A method of selective $WSi_x$ deposition in the fabrication of an integrated circuit device comprising:

providing polysilicon gate electrodes on the surface of a semiconductor substrate and source and drain regions within said semiconductor substrate; depositing an insulating layer over the surface of said substrate;

depositing a layer of organic material over said insulating layer;

etching through said organic material layer and said insulating layer to provide openings to said gate electrodes and to said source and drain regions wherein said organic material layer remains on a first portion of said substrate and wherein said organic material does not exist within said openings comprising a second portion of said substrate; and depositing a layer of $WSi_x$ over the surface of said substrate wherein said $WSi_x$ is deposited within said contact openings and wherein the presence of said organic material layer prevents said $WSi_x$ from depositing on said first portion of said substrate completing said selective $WSi_x$ deposition in the fabrication of said integrated circuit device.

15. The method according to claim 14 wherein said organic material comprises photoresist material.

16. The method according to claim 14 wherein said organic material comprises organic polymer material.

17. The method according to claim 14 wherein said organic material layer has a thickness of between about 1200 to 1500 Angstroms.

18. The method according to claim 14 wherein said $WSi_x$ layer within said contact openings comprises a barrier layer.

19. The method according to claim 14 further comprising depositing and patterning a conducting layer overlying said $WSi_x$ layer within said contact openings.

* * * * *